United States Patent
Tu et al.

(10) Patent No.: US 6,495,297 B1
(45) Date of Patent: Dec. 17, 2002

(54) TYPE MASK FOR COMBINING OFF AXIS ILLUMINATION AND ATTENUATING PHASE SHIFTING MASK PATTERNS

(75) Inventors: Chih-Chiang Tu, Tauyen (TW); San-De Tzu, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 9 days.

(21) Appl. No.: 09/666,314

(22) Filed: Sep. 21, 2000

Related U.S. Application Data

(62) Division of application No. 09/097,144, filed on Jun. 12, 1998, now Pat. No. 6,150,058.

(51) Int. Cl.[7] ............................................. G03F 9/00
(52) U.S. Cl. ....................................................... 430/5
(58) Field of Search ................................ 430/5; 378/34, 378/35

(56) References Cited

U.S. PATENT DOCUMENTS

| | | | |
|---|---|---|---|
| 5,480,747 A | 1/1996 | Vasuder | 430/5 |
| 5,481,332 A | 1/1996 | Shiraishi | 355/53 |
| 5,503,951 A | 4/1996 | Flanders et al. | 430/5 |
| 5,589,303 A | * 12/1996 | DeMarco et al. | 430/5 |
| 5,853,921 A | * 12/1998 | Moon et al. | 430/5 |
| 5,935,736 A | * 8/1999 | Tzu | 430/5 |
| 6,150,058 A | * 11/2000 | Tu et al. | 430/5 |
| 6,335,125 B2 | * 1/2002 | Matsuura | 430/5 |

OTHER PUBLICATIONS

"Optimization of the Optical Phase Shift in Attenuated PSN & Application to Quarter Micron Deep–UV Lithography for Logics", by K. Ronse et al, SPIE, vol. 2197, pp. 86–98.

"Quarter Micron Lithography System with Oplique Illumination and Pupil Filter" by S. Ori et al, SPIE, vol. 2197, pp. 854–868.

"Dependency of Side–Lobe Effect of Half–tone Phase Shift Mask on Substrate Technology, & Its Solutions" by Sung–Chui Lin et al, SPIE vol. 2512, pp. 372–383.

* cited by examiner

*Primary Examiner*—Mark F. Huff
*Assistant Examiner*—Saleha R. Mohamedulla
(74) *Attorney, Agent, or Firm*—George O. Saile; Stephen B. Ackerman; Larry J. Prescott

(57) ABSTRACT

A mask and method of forming a mask for forming electrode patterns having both closely spaced lines and lines with greater separation between them. The mask uses a pattern formed using attenuating phase shifting material for the region of the mask with lines with greater separation and a binary pattern formed using opaque material in the region of the mask with closely spaced lines. The mask design data is used to determine the mask regions using attenuating phase shifting material and the regions of the mask using a binary pattern. The mask is illuminated using off axis illumination, preferably quadrapole off axis illumination. The mask is formed using electron beam exposure of a resist using more than one exposure dose so that only one layer of resist is required to form the two regions of the mask one using attenuating phase shifting material and one using a binary pattern.

6 Claims, 5 Drawing Sheets

TYPE MASK FOR COMBINING OFF AXIS ILLUMINATION AND ATTENUATING PHASE SHIFTING MASK PATTERNS

This is a division of patent application Ser. No. 09/097,144, filing date Jun. 12, 1998 now U.S. Pat. No. 6,150,058, A New Type Mask For Combining Off Axis Illumination And Attenuating Phase Shifting Mask Patterns, assigned to the same assignee as the present invention.

BACKGROUND OF THE INVENTION (1) Field of the Invention

This invention relates to the use of masks using attenuating phase shifting material for regions of the pattern with relatively large spaces between lines and binary mask patterns using opaque material for regions of the pattern with relatively small spaces between lines on the same mask substrate. The mask is illuminated using off axis illumination when using the mask to form a pattern on an integrated circuit wafer. The mask is formed using a single resist layer exposed using multiple electron beam exposure doses.

(2) Description of the Related Art

U.S. Pat. No. 5,481,332 to Shiraishi describes a projection exposure method and apparatus for improved image transfer from photomasks having periodic and non-periodic patterns. The projection optical system uses off axis illumination to illuminate the photomask.

U.S. Pat. No. 5,503,951 to Flanders et al. describes a method of forming a photomask using attenuating phase shifting material.

U.S. Pat. No. 5,480,747 to Vasudev describes a method of forming a photomask using attenuating phase shifting material and using embedded absorbers.

A patent application ( ) entitled "A NEW DOUBLE LAYER METHOD FOR FABRICATING A RIM TYPE ATTENUATING PHASE SHIFTING MASK", Ser. No. 08/956,971, Filed on Oct. 3, 1997, and assigned to the same assignee describes a method of forming multiple patterns in a single layer of resist using two different electron beam exposure doses.

A patent application ( ) entitled "A MASK AND SIMPLIFIED METHOD OF FORMING A MASK INTEGRATING ATTENUATING PHASE SHIFTING MASK PATTERNS AND BINARY MASK PATTERNS ON THE SAME MASK SUBSTRATE", Ser. No. 09/020,502, Filed on Feb. 9, 1998, and assigned to the same assignee describes a binary mask pattern and a rim type attenuating phase shifting mask pattern formed on the same transparent mask substrate.

A paper entitled "Optimization of the optical phase shift in attenuated PSM and application to quarter micron deep-UV lithography for logics" by K. Ronse et al., SPIE Vol. 2197, pages 86–98 discusses optical techniques to achieve optimization of attenuated phase shifting masks.

A paper entitled "Quarter Micron Lithography System with Oblique Illumination and Pupil Filter" by S. Orii et al., SPIE Vol. 2197, pages 854–868 discusses the usefullness of pupil filtering.

A paper entitled "Dependency of side-lobe effect of half-tone phase shift mask on substrate material and topology, and its solutions" by Sung-Chul Lim et al., SPIE Vol. 2512, pages 372–383 discusses loss of resist due to side lobe effect.

SUMMARY OF THE INVENTION

In the manufacture of semiconductor integrated circuit wafers photolithographic processing methods having good resolution and a large depth of focus are required to form fine lines. The need for very close spacing between the fine lines places added requirements on the photolithographic processing. In regions of the pattern where the spacing between the fine lines is relatively large the use of masks using attenuating phase shifting material produces good results. In those regions of the pattern where the spacing between the fine lines is small, however, attenuating phase shifting material will not give good results due to side lobe effect.

In regions of the pattern where the spacing between the fine lines is small improved results can be obtained using binary masks and off axis illumination, OAI, of the masks. In the case where the parallel lines are in predominantly one direction dipole illumination using off axis illumination works well. In those cases where the parallel lines are in more than one direction quadrapole illumination using off axis illumination will be required.

It is a principle objective of this invention to provide a method of forming a mask having both attenuating phase shifting patterns and binary patterns on the same mask.

It is another principle objective of this invention to provide a method of exposing a layer of photoresist on a substrate using quadrapole off axis illumination of a mask having both attenuating phase shifting patterns and binary patterns on the same mask.

It is another principle objective of this invention to provide a mask having both attenuating phase shifting patterns and binary patterns on the same mask.

These objectives are achieved by forming a layer of attenuating phase shifting material on a transparent mask substrate. A layer of opaque material is formed on the layer of attenuating phase shifting material. The patterns are then formed in both the layer of opaque material and the layer of attenuating phase shifting material. In that part of the pattern comprising lines and spaces wherein the ratio of the width of the spaces between lines to the line width is large the opaque material is removed from the pattern and the pattern is formed using attenuating phase shifting material. In that part of the pattern comprising lines and spaces wherein the ratio of the width of the spaces between lines to the line width is small the opaque material is left in place and forms a binary pattern. The design data used to form the mask is analyzed to determine the regions of the mask in which the opaque material is removed and which regions of the mask the opaque material is left in place.

The mask is then used in a projection system to form the image of the mask on an integrated circuit wafer having a layer of photoresist formed thereon. The mask is illuminated using off axis illumination, preferably quadrapole off axis illumination, and the light passing through the mask is focussed on the layer of photoresist formed on the integrated circuit wafer.

In one embodiment the mask is formed using a single layer of resist. A layer of attenuating phase shifting material is formed on a transparent mask substrate and a layer of opaque material is formed on the layer of attenuating phase shifting material. A layer of resist is formed on the layer of opaque material. The region of the mask where the ratio of the spacing between the lines to the line width is large is exposed with a first exposure dose and the region of the mask where the ratio of the spacing between the lines is small is exposed with a second exposure dose. The resist is then developed leaving a thinner resist pattern in the region of the mask where the ratio of the spacing between the lines to the line width is large. That part of the opaque material and attenuating phase shifting material not covered by resist is then etched away. The resist is then partially etched away thereby removing resist from the region of the mask where the ratio of the spacing between the lines to the line width is large. The opaque material is then etched away from the region of the mask where the ratio of the spacing between the lines to the line width is large leaving a pattern formed of attenuating phase shifting material only. The remaining resist is then removed and the mask is completed.

DESCRIPTION OF THE PREFERRED EMBODIMENTS

Figure 1:
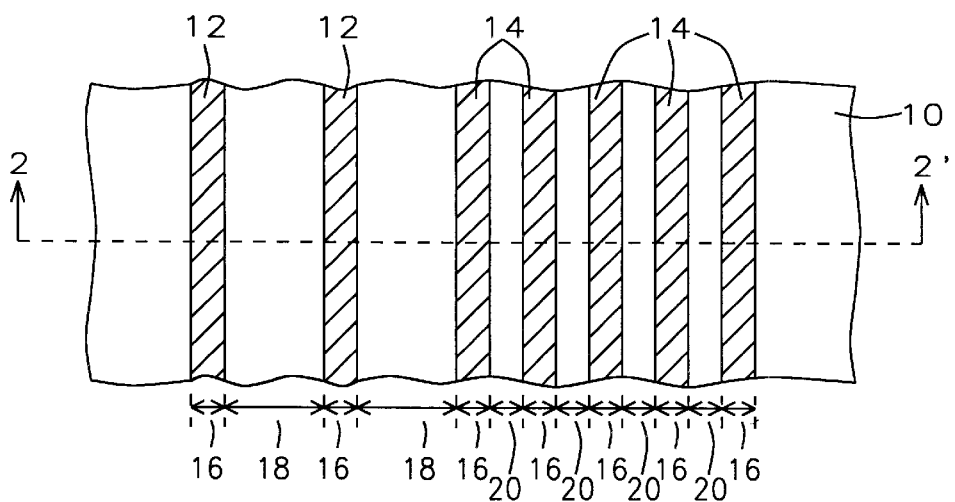
FIG. 1 shows a top view of an electrode pattern an a segment of an integrated circuit wafer.
Figure 2:
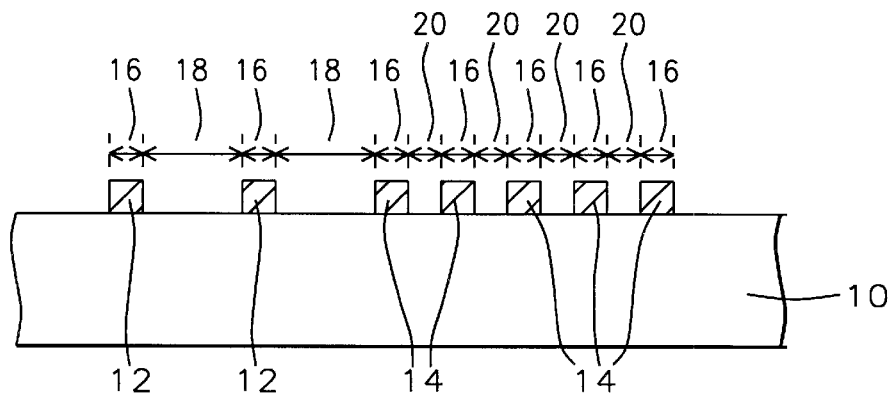
FIG. 2 shows a cross section view of the integrated circuit wafer segment of FIG. 1 along line 2–2' of FIG. 1.

Refer now to FIGS. 1–6B for a description of the preferred embodiments of the mask of this invention and the method of this invention of exposing a layer of photoresist on an integrated circuit wafer using mask having a pattern of both closely spaced and widely spaced lines on the same mask. FIG. 1 shows a top view of a segment of an integrated circuit wafer 10 showing an electrode pattern comprising a number of parallel lines, 12 and 14. The electrodes each have a line width 16. In a first part of the pattern the space between the electrodes 18 is relatively large and in a second part of the pattern the space between the electrodes 20 is relatively small. FIG. 2 shows a cross section view of the electrode pattern along line 2–2' of FIG. 1.

Figure 3:
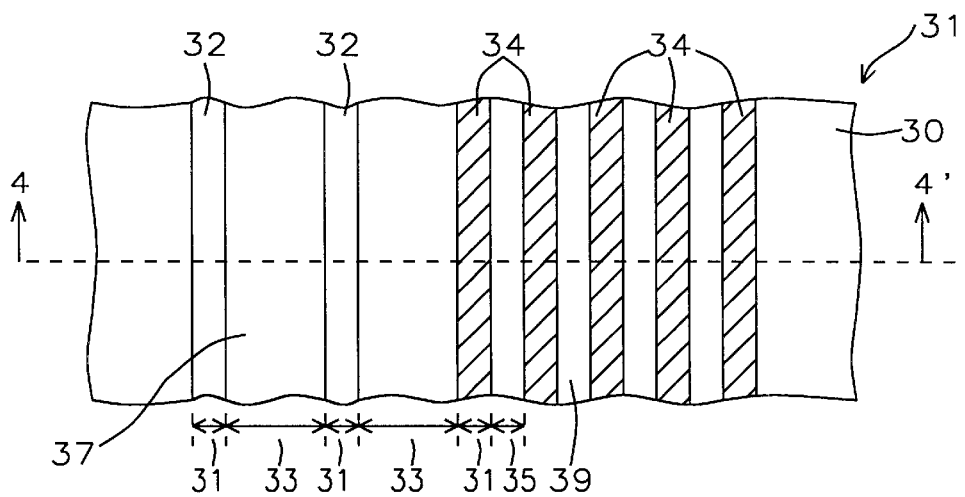
FIG. 3 shows a top view of a mask used in forming the electrode pattern of FIG. 1 on an integrated circuit wafer.
Figure 4:
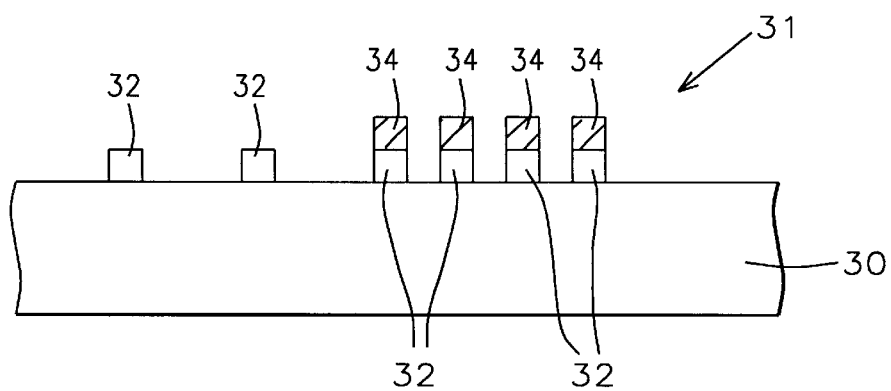
FIG. 4 shows a cross section view of the mask of FIG. 3 along line 4–4' of FIG. 3.

FIG. 3 shows a top view of a segment of a mask of this invention used to form the electrode pattern of FIGS. 1 and 2 on the integrated circuit wafer. FIG. 4 shows a cross section view of this mask segment taken along line 4–4' of FIG. 3. The mask has a first pattern region 37 where the ratio of the spacing 33 between lines 32 to the line width 31 is relatively large, greater than about 2.0, see FIG. 3. In the first pattern region the lines 32 are formed of attenuating phase shifting material such as MoSiO having a thickness of between about 900 and 1600 Angstroms. The TSMC-97-276 thickness of the MoSiO is dependent on the technology, transmittance of the attenuating phase shifting material, and the vendor of the mask blanks. The mask also has a second pattern region 39 where the ratio of the spacing 35 between lines 34 to the line width 31 is relatively small, less than about 2.0, see FIG. 3. In the second pattern region the lines 34 are opaque. In this example the lines in the second pattern region are formed of an opaque material 34, such as chrome having a thickness of between about 600 and 1200 Angstroms, formed over lines formed of attenuating phase shifting material, see FIG. 4.

This mask provides a first pattern and a second pattern on the same mask substrate. The first pattern is formed of attenuating phase shifting material in the first pattern region where the ratio of the spacing 33 between lines 32 to the line width 31 is relatively large and side lobe effect is not a problem. The second pattern is formed of opaque material, thereby forming a binary mask segment, in the second pattern region where the ratio of the spacing 35 between lines 34 to the line width 31 is relatively small and side lobe effect would be a problem if attenuating phase shifting material were used. The mask design data is used to determine which sections of the mask are formed using attenuating phase shifting material and which sections of the mask will have a binary pattern formed with opaque material. In order to obtain good resolution and depth of focus in the second pattern region the mask is illuminated using off axis illumination.

Figure 5:
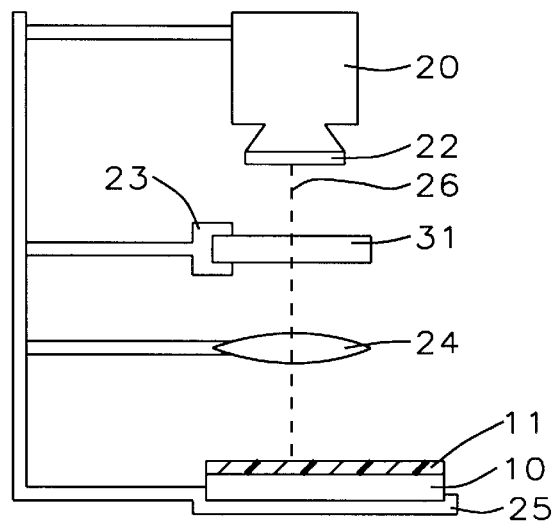
FIG. 5 shows a schematic diagram of a optical projection system used in photolithographic processing of integrated circuit wafers.

FIG. 5 shows a schematic diagram of an optical projection system used to expose a layer of photoresist in an integrated circuit wafer with the mask pattern. FIG. 5 shows a light source 20, an exit aperture 22 from the light source, a means 23 for holding the mask 31, a lens 24 to focus the light passing through the mask 31, and a wafer holder 25 holding an integrated circuit wafer 10 with a layer of photoresist 11 formed thereon. The projection system has an optical axis 26 which passes through the center of the lens 24. As shown in FIG. 5, the mask 31 is between the exit aperture 22 and the lens 24 and the lens 24 is between the mask 31 and the layer of photoresist 11 on the integrated circuit wafer 10. In order to illuminate the mask 31 the light must pass through the exit aperture 22. The mask is the mask described above having a first pattern of attenuating phase shifting material and a second pattern of opaque material forming a binary mask.

Figure 6A:
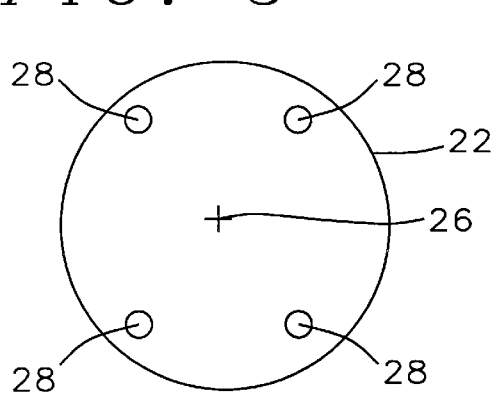
FIG. 6A shows an aperture used for quadrapole off axis illumination of a mask.
Figure 6B:
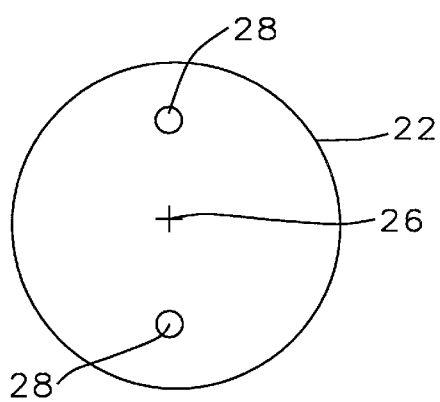
FIG. 6B shows an aperture used for dipole off axis illumination of a mask.

Two possible exit apertures 22 are shown in FIGS. 6A and 6B. The preferred exit aperture is shown in FIGS. 6A and shows an opaque panel with four openings 28 located away from the optical axis 26. The openings 28 are all an equal distance away from the optical axis 26 and located at the four corners of a square. This exit aperture provides quadrapole off axis illumination of the mask 31. Another possible exit aperture is shown in FIG. 6B and has an opaque panel with two openings 28. The two openings 28 are an equal distance away from the optical axis 26 and the two openings and the optical axis are co-linear. This exit aperture provides dipole off axis illumination of the mask 31. These exit apertures, FIGS. 6A and 6B, provide illumination of the photomask from oblique directions, at a small angle from the optical axis, which provides improved resolution and depth of field for patterns which have a number of closely spaced parallel lines.

Figure 7:
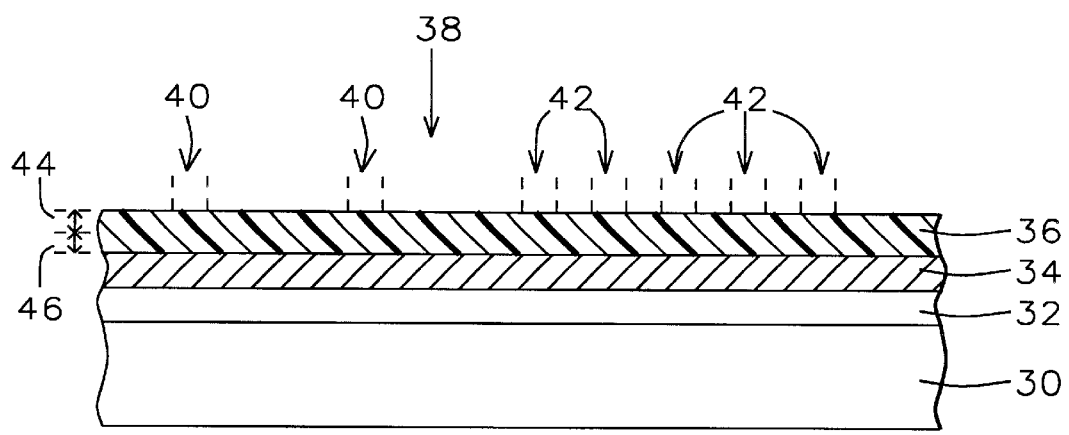
FIG. 7 shows a cross section view of a mask substrate with a layer of attenuating phase shifting material, a layer of opaque material, and a layer of resist formed thereon.

Refer now to FIGS. 7–13 for the preferred embodiment of a method of forming the mask of this invention. FIG. 7 shows a cross section view of a transparent mask substrate 30. A layer of attenuating phase shifting material 32, such as MoSiO having a thickness of between about 300 and 1600 Angstroms. A layer of opaque material 34, such as chrome having a thickness of between about 600 and 1200 Angstroms, is deposited on the layer of attenuating phase shifting material. A layer of resist 36 is formed on the layer of opaque material 34. The layer of resist is composed of a first thickness 44 at the top of the layer of resist 36 and a second thickness at the bottom of the layer of resist 36. A first pattern will be formed in the layer of resist 36 in the regions 40 where the ratio of the spacing 33 between lines 32 to the line width 31 is relatively large, greater than about 2.0, see FIG. 3. A second pattern will be formed in the layer of resist 36 in the regions 42 where the ratio of the spacing 33 between lines 32 to the line width 31 is relatively small, less than about 2.0, see FIG. 3. The layer of resist 36 is exposed using an electron beam 38 using with different exposure doses.

Figure 8:
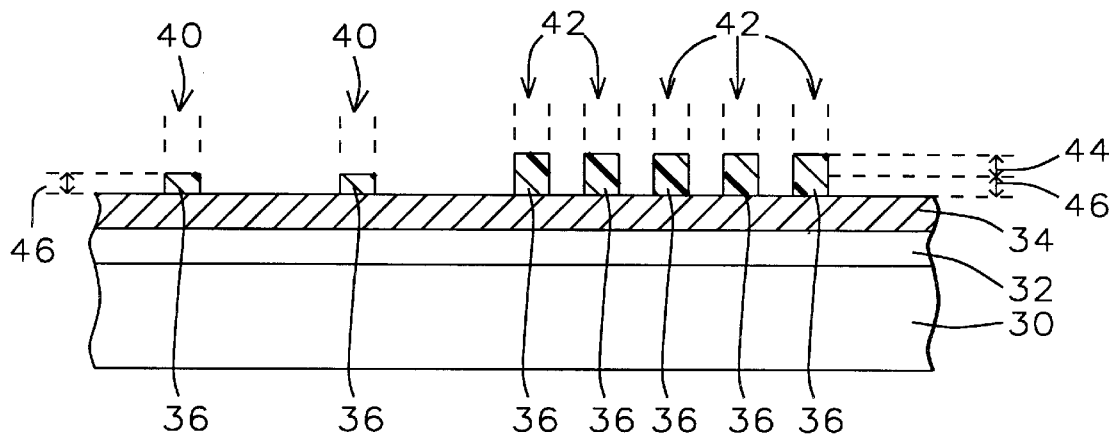
FIG. 8 shows a cross section view of the mask of FIG. 7 after the layer of resist has been exposed and developed.
Figure 9:
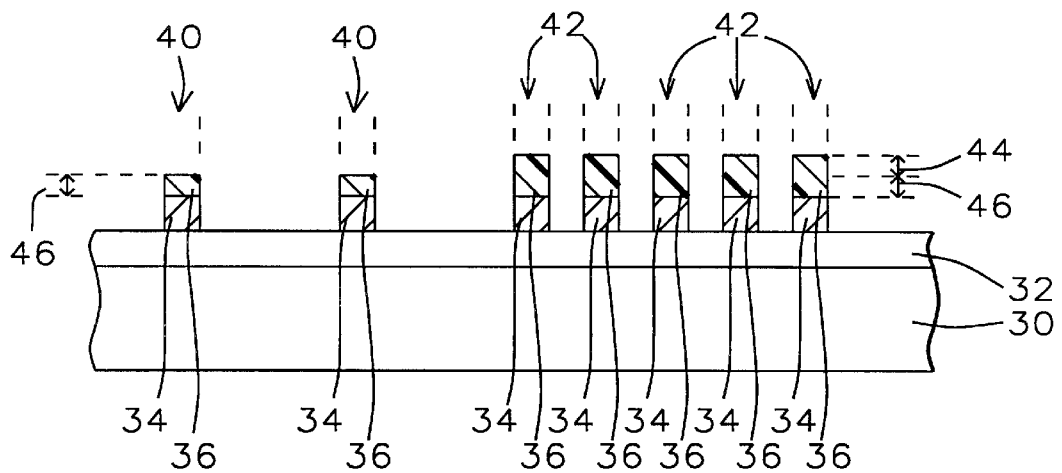
FIG. 9 shows a cross section view of the mask of FIG. 8 after the layer of opaque material has been etched.
Figure 10:
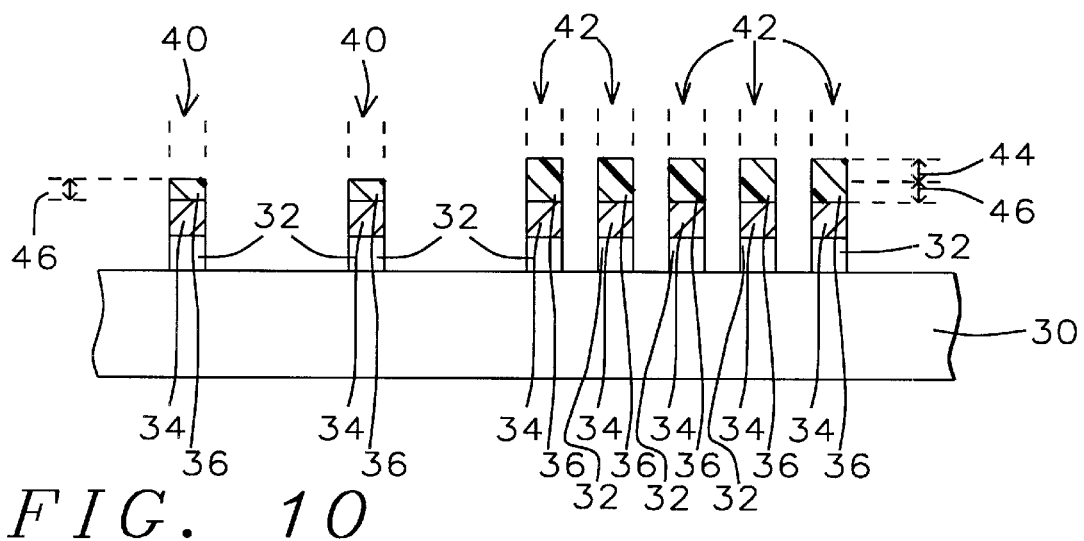
FIG. 10 shows a cross section view of the mask of FIG. 9 after the layer of attenuating phase shifting material has been etched.

As shown in FIG. 8, the layer of resist is then developed. The exposure of the layer of resist is such that after developing the layer of resist 36, the first pattern will be formed in only the second thickness 46 of the layer of resist and the second pattern will be formed in both the first thickness 44 and second thickness 46 of the layer of resist. As shown in FIG. 9, that part of the layer of opaque material not covered by resist is etched away using either wet or dry isotropic etching, preferably wet isotropic etching, following methods well established in mask fabrication technology. Next, as shown in FIG. 10, that part of the layer of attenuating phase shifting material not covered by resist is etched away using dry anisotropic etching following methods well established in mask fabrication technology.

Figure 11:
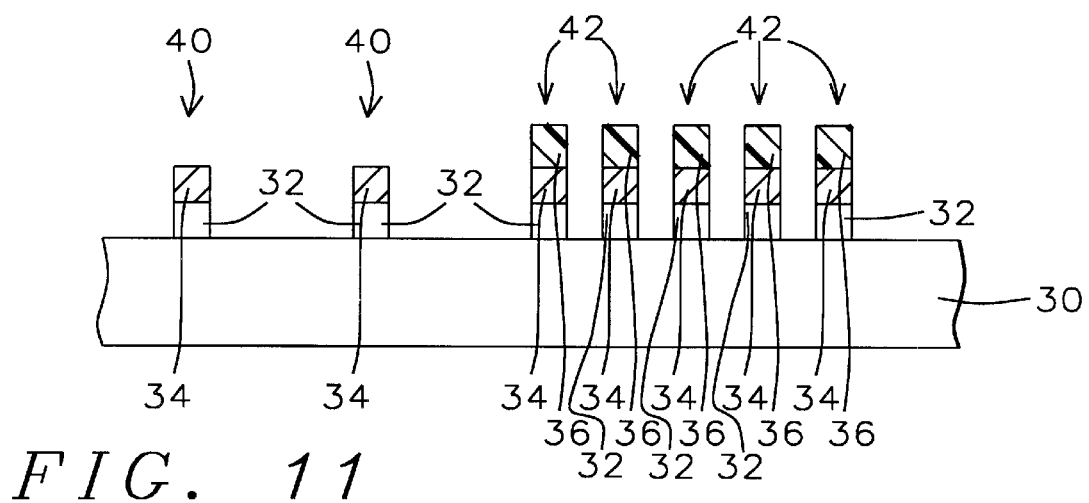
FIG. 11 shows a cross section view of the mask of FIG. 10 after part of the resist mask has been etched away.
Figure 12:
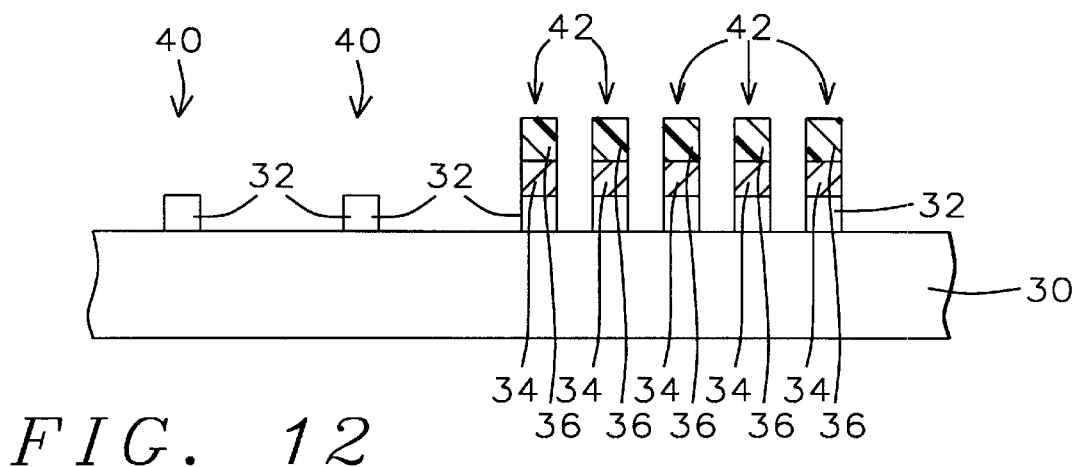
FIG. 12 shows a cross section view of the mask of FIG. 11 after the opaque material has been etched away from that part of the pattern in the region where the ratio of the space between the lines to the line width is large.
Figure 13:
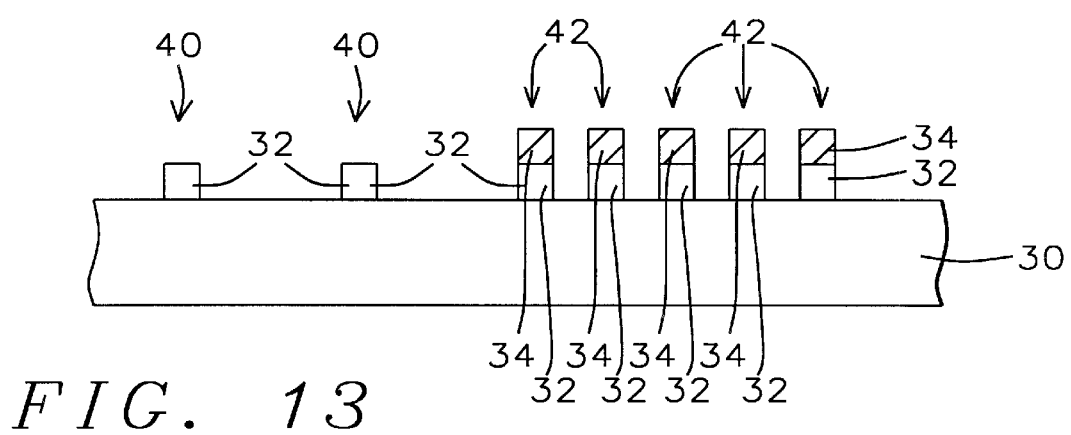
FIG. 13 shows a cross section view of the completed mask after the remaining resist has been removed.

Next, as shown in FIG. 11, part of the resist is etched away using dry anisotropic etching. The dry anisotropic etching removes an amount of resist equivalent to the second thickness so that all the resist is removed from the first pattern of the layer of resist the regions 40 where the ratio of the spacing between lines to the line width 31 is relatively large. This leaves the second pattern formed in a first thickness of the layer of resist 36 in the regions 42 where the ratio of the spacing between lines to the line width is relatively small. Next, as shown in FIG. 12 any opaque material not covered by resist is etched away using either wet or dry isotropic etching, preferably wet isotropic etching, following methods well established in mask fabrication technology. As shown in FIG. 13 the remaining resist is then removed and the mask is completed. The mask design data is used to determine which sections of the mask are formed using attenuating phase shifting material and which sections of the mask will have a binary pattern formed with opaque material.

While the invention has been particularly shown and described with reference to the preferred embodiments thereof, it will be understood by those skilled in the art that various changes in form and details may be made without departing from the spirit and scope of the invention.

What is claimed is:

1. A photomask, comprising:
   a transparent mask substrate having a first region and a second region;
   a first pattern formed of attenuating phase shifting material on said first region of said transparent mask substrate, wherein said first pattern comprises parallel lines having a first distance between adjacent lines and each said line has a line width of a second distance;
   a second pattern formed of said attenuating phase shifting material on said second region of said transparent mask substrate, wherein said second pattern comprises parallel lines having a third distance between adjacent lines and each said line has a line width of a fourth distance and wherein the ratio of said fourth distance to said third distance is greater than the ratio of said second distance to said first distance; and
   opaque material formed on said attenuating phase shifting material forming said second pattern.

2. The photomask of claim 1 wherein the ration of said second distance to said first distance is less than about 2.0.

3. The photomask of claim 1 wherein the ratio of said fourth distance to said third distance is greater than about 2.0.

4. The photomask of claim 1 wherein said opaque material is chrome having a thickness of between about 600 and 1200 Angstroms.

5. The photomask of claim 1 wherein said layer of attenuating phase shifting material is MoSiO having a thickness of between about 900 and 1600 Angstroms.

6. The photomask of claim 1 wherein said transparent mask substrate is quartz having a thickness of about 0.25 inches.

* * * * *